(12) United States Patent
Meyer et al.

(10) Patent No.: US 9,315,617 B2
(45) Date of Patent: Apr. 19, 2016

(54) CROSSLINKABLE AND CROSSLINKED POLYMERS, METHOD FOR THE PRODUCTION THEREOF, AND USE THEREOF

(75) Inventors: Frank Egon Meyer, Hampshire (GB); Niels Schulte, Kelkheim (DE); René Peter Scheurich, Gross-Zimmern (DE); Rémi Manouk Anémian, Seoul (KR); Aurélie Ludemann, Frankfrut (DE); Alice Julliart, Frankfurt am Main (DE)

(73) Assignee: Merck Patent GmbH, Darmstadt (DE)

( * ) Notice: Subject to any disclaimer, the term of this patent is extended or adjusted under 35 U.S.C. 154(b) by 1207 days.

(21) Appl. No.: 13/203,567

(22) PCT Filed: Feb. 1, 2010

(86) PCT No.: PCT/EP2010/000591
§ 371 (c)(1),
(2), (4) Date: Aug. 26, 2011

(87) PCT Pub. No.: WO2010/097156
PCT Pub. Date: Sep. 2, 2010

(65) Prior Publication Data
US 2011/0303877 A1    Dec. 15, 2011

(30) Foreign Application Priority Data

Feb. 27, 2009   (DE) .................. 10 2009 010 714

(51) Int. Cl.
| | | |
|---|---|---|
| *H01B 1/00* | (2006.01) |
| *C09K 11/02* | (2006.01) |
| *C08G 79/08* | (2006.01) |
| *C07C 211/00* | (2006.01) |
| *C08G 61/12* | (2006.01) |
| *C09D 125/18* | (2006.01) |
| *C09D 165/00* | (2006.01) |
| *H01L 51/50* | (2006.01) |
| *H01L 27/32* | (2006.01) |

(52) U.S. Cl.
CPC ............ *C08G 61/122* (2013.01); *C09D 125/18* (2013.01); *C09D 165/00* (2013.01); *H01L 51/5096* (2013.01); *H01L 27/3211* (2013.01)

(58) Field of Classification Search
None
See application file for complete search history.

(56) References Cited

U.S. PATENT DOCUMENTS

| 5,518,824 A | 5/1996 | Funhoff et al. |
|---|---|---|
| 5,621,131 A | 4/1997 | Kreuder et al. |
| 6,107,452 A | 8/2000 | Miller et al. |
| 6,653,438 B1 | 11/2003 | Spreitzer et al. |
| 7,893,160 B2 | 2/2011 | Inbasekaran et al. |
| 7,956,350 B2 | 6/2011 | Inbasekaran et al. |

| 2001/0017155 A1 | 8/2001 | Bellmann et al. |
|---|---|---|
| 2004/0133004 A1 | 7/2004 | Stossel et al. |
| 2004/0135131 A1 | 7/2004 | Treacher et al. |
| 2004/0138455 A1 | 7/2004 | Stossel et al. |
| 2004/0206939 A1 | 10/2004 | Spreitzer et al. |
| 2004/0225056 A1 | 11/2004 | Spreitzer et al. |
| 2004/0260090 A1 | 12/2004 | Treacher et al. |
| 2005/0186444 A1* | 8/2005 | Zheng et al. .................. 428/690 |
| 2006/0058494 A1 | 3/2006 | Busing et al. |
| 2006/0127696 A1 | 6/2006 | Stossel et al. |
| 2006/0175958 A1 | 8/2006 | Gerhard et al. |
| 2006/0229427 A1 | 10/2006 | Becker et al. |
| 2006/0284140 A1 | 12/2006 | Breuning et al. |
| 2007/0060736 A1 | 3/2007 | Becker et al. |
| 2007/0096082 A1 | 5/2007 | Gaynor et al. |
| 2007/0135635 A1 | 6/2007 | Stossel et al. |
| 2007/0205714 A1 | 9/2007 | Busing et al. |
| 2007/0281182 A1 | 12/2007 | Schulte et al. |
| 2009/0226759 A1 | 9/2009 | Heun et al. |
| 2009/0227765 A1* | 9/2009 | Towns et al. .................. 528/422 |
| 2010/0102305 A1 | 4/2010 | Heun et al. |
| 2010/0171100 A1 | 7/2010 | Nakatani et al. |
| 2010/0288974 A1 | 11/2010 | Buesing et al. |
| 2011/0068304 A1 | 3/2011 | Parham et al. |
| 2011/0105711 A1 | 5/2011 | Inbasekaran et al. |
| 2013/0085258 A1 | 4/2013 | Gaynor et al. |

FOREIGN PATENT DOCUMENTS

| DE | 102005037734 A1 | 2/2007 |
|---|---|---|
| EP | 028136 A1 | 5/1981 |
| EP | 0637899 A1 | 2/1995 |
| EP | 0 707 020 A2 | 4/1996 |
| EP | 0 842 208 A1 | 5/1998 |
| EP | 0 894 107 A1 | 2/1999 |
| EP | 1 239 526 A2 | 9/2002 |
| EP | 1832616 A1 | 9/2007 |
| JP | 2007031704 A | 2/2007 |
| JP | 2007-511636 A | 5/2007 |
| JP | 2007-528916 A | 10/2007 |
| JP | 2008-517135 A | 5/2008 |
| JP | 2009-283509 A | 12/2009 |
| JP | 2009283509 A * | 12/2009 |
| WO | WO-90/13148 A1 | 11/1990 |
| WO | WO-92/18552 A1 | 10/1992 |
| WO | WO-96/20253 A1 | 7/1996 |
| WO | WO-97/05184 A1 | 2/1997 |
| WO | WO-97/39045 A1 | 10/1997 |
| WO | WO-00/22026 A1 | 4/2000 |

(Continued)

*Primary Examiner* — Mark Kopec
*Assistant Examiner* — Jaison Thomas
(74) *Attorney, Agent, or Firm* — Drinker Biddle & Reath LLP

(57) ABSTRACT

The present invention relates to cross-linkable and cross-linked polymers and to a method for the production thereof. The invention further relates to the use of said polymers in electronic devices and to the corresponding electronic devices themselves.

13 Claims, No Drawings

(56) References Cited

FOREIGN PATENT DOCUMENTS

| WO | WO-02/068435 A1 | 9/2002 |
| WO | WO-02/072714 A1 | 9/2002 |
| WO | WO-02/077060 A1 | 10/2002 |
| WO | WO-02/081488 A1 | 10/2002 |
| WO | WO-03/001969 A2 | 3/2003 |
| WO | WO-03/048225 A2 | 6/2003 |
| WO | WO-03/057762 A1 | 7/2003 |
| WO | WO-2004/026886 A2 | 4/2004 |
| WO | WO-2004/037887 A2 | 5/2004 |
| WO | WO-2004/041901 A1 | 5/2004 |
| WO | WO-2004/070772 A2 | 8/2004 |
| WO | WO-2004/113412 A2 | 12/2004 |
| WO | WO-2004/113468 A1 | 12/2004 |
| WO | WO-2005/011013 A1 | 2/2005 |
| WO | WO-2005/014688 A2 | 2/2005 |
| WO | WO-2005/014689 A2 | 2/2005 |
| WO | WO-2005/040302 A1 | 5/2005 |
| WO | WO-2005/042548 A1 | 5/2005 |
| WO | WO-2005/052027 A1 | 6/2005 |
| WO | WO-2005/104264 A1 | 11/2005 |
| WO | WO-2006/003000 A1 | 1/2006 |
| WO | WO-2006/043087 A1 | 4/2006 |
| WO | WO-2006/061181 A1 | 6/2006 |
| WO | WO-2006/137434 A1 | 12/2006 |

* cited by examiner

CROSSLINKABLE AND CROSSLINKED POLYMERS, METHOD FOR THE PRODUCTION THEREOF, AND USE THEREOF

RELATED APPLICATIONS

This application is a national stage application (under 35 U.S.C. §371) of PCT/EP2010/000591, filed Feb. 1, 2010, which claims benefit of German Application No. 10 2009 010 714.2, filed Feb. 27, 2009.

The present invention relates to crosslinkable and crosslinked polymers and to a process for the preparation thereof. The invention is furthermore directed to the use of these polymers in electronic devices and to the corresponding electronic devices themselves.

Electronic devices which comprise organic, organometallic and/or polymeric semiconductors are being used ever more frequently in commercial products or are just about to be introduced onto the market. Examples which may be mentioned here are organic-based charge-transport materials (for example triarylamine-based hole transporters) in photocopiers, organic or polymeric light-emitting diodes (OLEDs or PLEDs) and in display devices or organic photoreceptors in photocopiers. Organic solar cells (O-SCs), organic field-effect transistors (O-FETs), organic thin-film transistors (O-TFTs), organic integrated circuits (O-ICs), organic optical amplifiers and organic laser diodes (O-lasers) are at an advanced stage of development and may achieve major importance in the future.

Irrespective of the particular application, many of these electronic devices have the following general layer structure, which can be adapted for the particular application:
(1) substrate,
(2) electrode, frequently metallic or inorganic, but also comprising organic or polymeric conductive materials,
(3) charge-injection layer(s) or interlayer(s), for example for levelling out unevenness of the electrode ("planarisation layer"), frequently comprising a conductive, doped polymer,
(4) organic semiconductors,
(5) optionally further charge-transport, charge-injection or charge-blocking layers,
(6) counterelectrode, materials as mentioned under (2),
(7) encapsulation.

The above arrangement represents the general structure of an organic, electronic device, where various layers may be combined, giving in the simplest case an arrangement comprising two electrodes, between which an organic layer is located. The organic layer in this case takes on all functions, including the emission of light in the case of OLEDs. A system of this type is described, for example, in WO 90/13148 A1 on the basis of poly(p-phenylenes).

A problem which arises in a "three-layer system" of this type is, however, the lack of control of charge separation or the lack of a possibility for optimising the individual constituents in different layers with respect to their properties, as is solved in a simple manner, for example, in the case of SMOLEDs ("small-molecule OLEDs") by means of a multilayered structure.

A "small-molecule OLED" consists, for example, of one or more organic hole-injection layers, hole-transport layers, emission layers, electron-transport layers and/or electron-injection layers and an anode and a cathode, where the entire system is usually located on a glass substrate. The advantage of a multilayered structure of this type consists in that various functions of charge injection, charge transport and emission can be divided over the various layers and the properties of the respective layers can thus be modified separately.

The layers in SMOLEDs are usually applied by vapour deposition in a vacuum chamber. However, this process is complex and thus expensive and is unsuitable, in particular, for large molecules, such as, for example, polymers.

Polymeric OLED materials are therefore usually applied by coating from solution. However, the production of a multilayered organic structure by coating from solution requires that the solvent of the layer to be applied does not re-dissolve, swell or even destroy the respective preceding layer. However, the choice of solvent proves to be difficult, since the organic polymers employed usually have similar chemical structures and properties, in particular similar solution properties.

Correspondingly, polymeric OLEDs (PLEDs) in accordance with the prior art are usually built up only from a single-layered or at most two-layered organic structure, where, for example, one of the layers is used for hole injection and hole transport and the second layer is used, for example, for injection and transport of electrons and for emission.

However, a multilayered structure as in the case of SMOLEDs would also be advantageous in the case of polymeric OLEDs. Various approaches to this end are described in the prior art.

Thus, for example, EP 0 637 899 A1 discloses an electroluminescent arrangement comprising one or more organic layers, where one or more of the layers are obtained by thermal or radiation-induced crosslinking.

In the case of radiation-induced crosslinking using high-energy, electromagnetic radiation, molecules or moieties which are able to trigger free-radical, cationic or anionic polymerisation are frequently necessary. However, it is known from the prior art that molecules or moieties of this type may have adverse effects on the function of an optoelectronic device. The use of high-energy, electromagnetic radiation may also be problematic.

A problem in the case of thermal crosslinking is that the polymeric layers are subjected to a relatively high temperature, which in some cases again results in destruction of the corresponding layer or in the formation of undesired by-products.

Thus, for example, WO 96/20253 discloses a luminescent, film-forming, crosslinked polymer which can be prepared by solvent treatment, where azide groups which are attached to the main polymer chain are thermally crosslinked.

U.S. Pat. No. 6,107,452 discloses a process for the formation of a multilayered device in which oligomers containing terminal vinyl groups are deposited from solution and crosslinked to give insoluble polymers, on which further layers can be deposited.

K. Meerholz et al. (Nature, Volume 421, Feb. 20, 2003, pages 829 to 832) disclose the production of a multilayered, organic, light-emitting device in which crosslinking is achieved by incorporation of oxetane-functionalised spirobifluorene base units into the polymer.

WO 2006/043087 discloses that fluorenes functionalised by means of crosslinking groups do not crosslink very effectively. This means that the polymer may partially remain soluble, even after the crosslinking. Accordingly, the integrity of the layer may not be guaranteed on application of a subsequent layer.

Thus, there continues to be a demand for polymers which have a functional group which is suitable for crosslinking, can be crosslinked easily, i.e. with low energy expenditure, and have no adverse effects on the function of an electronic device.

The object of the present invention thus consisted in the provision of such polymers.

Surprisingly, it has been found that para-substituted aryldiarylamines in which the 4-position of an aryl ring is provided with a crosslinkable group, or homologues thereof which are bonded to the polymer backbone, such as, for example, fluorene, indenofluorene, phenanthrene and the like, either directly via an aryl group or a non-aromatic spacer, do not exhibit these disadvantages. This structural unit exerts no influence on the opto-electronic properties of the main polymer chain, but facilitates crosslinking between two or more main chains. This is surprising since, as already mentioned above, WO 2006/043087 discloses that fluorenes functionalised, in particular, by means of crosslinking groups do not crosslink very effectively. The crosslinking here can take place thermally or with radiation induction, where, owing to the good crosslinking behaviour of the system according to the invention, smaller amounts of energy are necessary than in the case of the known systems. Fewer undesired by-products thus arise on crosslinking. In addition, the polymer according to the invention has very high stability.

To this end, the invention provides a polymer which contains at least one structural unit of the general formula I,

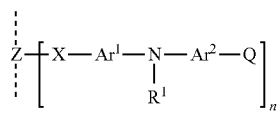

I where
Z is an aromatic or heteroaromatic ring system, which may be substituted by one or more radicals R of any desired type,
X is a spacer group or a direct bond,
$Ar^1$, $Ar^2$ are an aryl or heteroaryl group, which may be substituted by one or more radicals R of any desired type or may be linked to one another,
Q is a crosslinkable group,
$R^1$ is a straight-chain alkyl, alkoxy or thioalkoxy group having 1 to 40 C atoms or a branched or cyclic alkyl, alkoxy or thioalkoxy group having 3 to 40 C atoms or a silyl group or substituted keto group having 1 to 40 C atoms, or a substituted or unsubstituted aromatic or heteroaromatic ring system having 5 to 60 ring atoms, or an aryloxy or heteroaryloxy group having 5 to 60 ring atoms, or a combination of these systems, or $Ar^2$, where one or more H atoms may be replaced by fluorine,
n is 1, 2, 3 or 4, and
the dashed lines represent the linking in the polymer,
where, if n=1,
or if Z=fluorene and n=2,
X is not a direct bond.

"Crosslinkable group" means a functional group which is capable of reacting irreversibly. A crosslinked material, which is insoluble, is thereby formed. The crosslinking can usually be supported by heat or by UV, microwave, X-ray or electron radiation. Due to the high stability of the polymer according to the invention, less by-product formation occurs during the crosslinking. In addition, the crosslinkable groups in the polymer according to the invention crosslink very easily, meaning that lower amounts of energy are necessary for the crosslinking (for example <200° C. in the case of thermal crosslinking).

Examples of crosslinkable groups Q are units which contain a double bond, a triple bond, a precursor which is capable of in-situ formation of a double or triple bond, or a heterocyclic addition-polymerisable radical. Preferred radicals Q include vinyl, alkenyl, preferably ethenyl and propenyl, $C_{4-20}$-cycloalkenyl, azide, oxirane, di(hydrocarbyl)amino, cyanate ester, hydroxyl, glycidyl ether, $C_{1-10}$-alkyl acrylate, $C_{1-10}$-alkyl methacrylate, alkenyloxy, preferably ethenyloxy, perfluoroalkenyloxy, preferably perfluoroethenyloxy, alkynyl, preferably ethynyl, maleimide, tri($C_{1-4}$)-alkylsiloxy and tri($C_{1-4}$)-alkyl-silyl. Particular preference is given to vinyl and alkenyl.

X serves as so-called spacer or spacer group. Spacers X which can be employed are all groups known for this purpose to the person skilled in the art. For the purposes of this invention, however, X can also be a direct bond, in which case $Ar^1$ is bonded directly to Z.

X is preferably a linear or branched alkylene group having 1 to 20 C atoms, particularly preferably having 1 to 12 C atoms, in which one or more non-adjacent $CH_2$ groups may be replaced by —O—, —S—, —NH—, —N($CH_3$)—, —N—CO—, —N—CO—O—, —N—CO—N—, —CO—, —O—CO—, —S—CO—, —O—COO—, —CO—S—, —CO—O—, —CH(halogen)-, —CH(CN)—, —CH═CH— —C≡C— or a cyclic alkyl group, preferably cyclohexane or a cyclohexane derivative with 1,4- or 1,3-linking. Further possible spacer groups X are, for example, —($CH_2$)$_o$—, —($CH_2CH_2O$)$_p$—$CH_2CH_2$—, —$CH_2CH_2$—S—$CH_2CH_2$— or —$CH_2CH_2$—NH—$CH_2CH_2$—, where o=2 to 12 and p=1 to 3, but also —O—.

Particularly preferred spacer groups X are ethylene, propylene, butylene, pentylene, hexylene, heptylene, octylene, nonylene, decylene, undecylene, dodecylene, octadecylene, ethyleneoxyethylene, methyleneoxybutylene, ethylenethioethylene, ethylene-N-methyliminoethylene, 1-methylalkylene, ethenylene, propenylene or butenylene.

It is particularly preferred for X to denote an alkylene or alkyleneoxy group having 2 to 8 C atoms. Straight-chain groups are particularly preferred here.

For the purposes of the present invention, Z is an aromatic or heteroaromatic ring system having 5 to 60 ring atoms, which may be substituted by one or more radicals R of any desired type. Z forms the skeleton of the structural unit of the general formula I and thus the so-called polymer backbone.

The aromatic ring system Z in the sense of the present invention contains 5 to 60 C atoms in the ring system. The heteroaromatic ring system Z in the sense of the present invention contains 2 to 60 C atoms and at least one heteroatom in the ring system, with the proviso that the sum of C atoms and heteroatoms is at least 5. The heteroatoms are preferably selected from Si, N, P, O, S and/or Se. An aromatic or heteroaromatic ring system in the sense of the present invention is, in addition, intended to be taken to mean a system which does not necessarily contain only aryl or heteroaryl groups, but instead in which a plurality of aryl or heteroaryl groups may also be interrupted by a non-aromatic unit (preferably less than 10% of the atoms other than H), such as, for example, an $sp^3$-hybridised C atom, an N atom or an O atom. Thus, for example, systems such as 9,9'-spirobifluorene, 9,9-diarylfluorene, triarylamine, diaryl ethers, stilbene, etc., are also intended to be taken to be aromatic ring systems in the sense of the present invention, as are systems in which two or more aryl groups are interrupted, for example, by a linear or cyclic alkyl group or by a silyl group. P═O or C═O groups are usually not conjugation-interrupting.

An aromatic or heteroaromatic ring system having 5 to 60 ring atoms, which may also in each case be substituted by any desired radicals R and which may be linked to the aromatic or heteroaromatic moiety via any desired positions, is taken to mean, in particular, groups derived from benzene, naphthalene, anthracene, phenanthrene, pyrene, chrysene, perylene, fluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine, benzothiadiazole, benzanthrene, benzanthracene, rubicene and triphenylene. For the purposes of the present invention, Z is particularly preferably equal to fluorene, spirobifluorene, indenofluorene, anthracene, phenanthrene, dihydrophenanthrene or carbazole.

In the structural unit of the general formula I, $Ar^1$ and $Ar^2$ are each, independently of one another, an aryl or heteroaryl group having 5 to 60 ring atoms, which may be substituted by one or more radicals R of any desired type.

An aryl group in the sense of the present invention contains 5 to 60 C atoms; a heteroaryl group in the sense of the present invention contains 2 to 60 C atoms and at least one heteroatom, with the proviso that the sum of C atoms and heteroatoms is at least 5. The heteroatoms are preferably selected from N, O and/or S. An aryl group or heteroaryl group here is taken to mean either a simple aromatic ring, i.e. benzene, or a simple heteroaromatic ring, for example pyridine, pyrimidine, thiophene, etc., or a condensed aryl or heteroaryl group, for example naphthalene, anthracene, phenanthrene, quinoline, isoquinoline, benzothiophene, benzofuran and indole, etc.

For the purposes of the present invention, the radicals $Ar^1$ and $Ar^2$ in the structural unit of the general formula I are particularly preferably each, independently of one another, derived from benzene, naphthalene, pyridine, anthracene, phenanthrene, pyrimidine, pyrazine, pyridazine, quinoline, isoquinoline, furan, thiophene, pyrrole, benzofuran, benzothiophene and indole, where benzene, naphthalene, pyridine, anthracene, phenanthrene, quinoline and isoquinoline are particularly preferred.

In a preferred embodiment of the present invention, $Ar^1$ is a 1,4-linked aryl or heteroaryl group, which may be substituted by one or more radicals R of any desired type.

In the structural unit of the general formula I, it is furthermore preferred for R to be selected on each occurrence, independently of one another, from F, Cl, Br, I, $N(Ar)_2$, $N(R^2)_2$, CN, $NO_2$, $Si(R^2)_3$, $B(OR^2)_2$, $C(=O)Ar$, $C(=O)R^2$, $P(=O)(Ar)_2$, $P(=O)(R^2)_2$, $S(=O)Ar$, $S(=O)R^2$, $S(=O)_2Ar$, $S(=O)_2R^2$, $-CR^2=CR^2Ar$, $OSO_2R^2$, a straight-chain alkyl, alkoxy or thioalkoxy group having 1 to 40 C atoms or a branched or cyclic alkyl, alkoxy or thioalkoxy group having 3 to 40 C atoms, each of which may be substituted by one or more radicals $R^2$, where one or more non-adjacent $CH_2$ groups may be replaced by $R^2C=CR^2$, $C\equiv C$, $Si(R^2)_2$, $Ge(R^2)_2$, $Sn(R^2)_2$, $C=O$, $C=S$, $C=Se$, $C=NR^2$, $P(=O)(R^2)$, SO, $SO_2$, $NR^2$, O, S or $CONR^2$ and where one or more H atoms may be replaced by F, Cl, Br, I, CN or $NO_2$, or an aromatic or heteroaromatic ring system having 5 to 60 ring atoms, which may in each case be substituted by one or more radicals $R^2$, or an aryloxy or heteroaryloxy group having 5 to 60 ring atoms, which may be substituted by one or more radicals $R^2$, or a combination of these systems, where two or more substituents R may also form a mono- or polycyclic, aliphatic or aromatic ring system with one another, where $R^2$ is in each case, independently of one another, H or an aliphatic or aromatic hydrocarbon radical having 1 to 20 C atoms.

For the purposes of the present invention, an alkyl group having 1 to 40 C atoms, in which, in addition, individual H atoms or $CH_2$ groups may be substituted by the above-mentioned groups or radicals R, is preferably taken to mean the radicals methyl, ethyl, n-propyl, i-propyl, cyclopropyl, n-butyl, i-butyl, s-butyl, t-butyl, cyclobutyl, 2-methylbutyl, n-pentyl, s-pentyl, cyclopentyl, n-hexyl, cyclohexyl, n-heptyl, cycloheptyl, n-octyl, cyclooctyl, 2-ethyl-hexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl or octynyl. An alkoxy group having 1 to 40 C atoms is preferably taken to mean methoxy, trifluoromethoxy, ethoxy, n-propoxy, i-propoxy, n-butoxy, i-butoxy, s-butoxy, t-butoxy or 2-methylbutoxy.

Particularly preferred structural units of the general formula I are listed in the following table:

In the table, the continuous bond dashes (in the case of Z) represent the link to the next structural units, and the dashed bond dashes (in the case of Z, X, $Ar^1$, $R^1$, $Ar^2$ and Q) represent the link of the individual elements of the structural unit of the general formula I, where the individual elements are in each case linked to one another by a single bond.

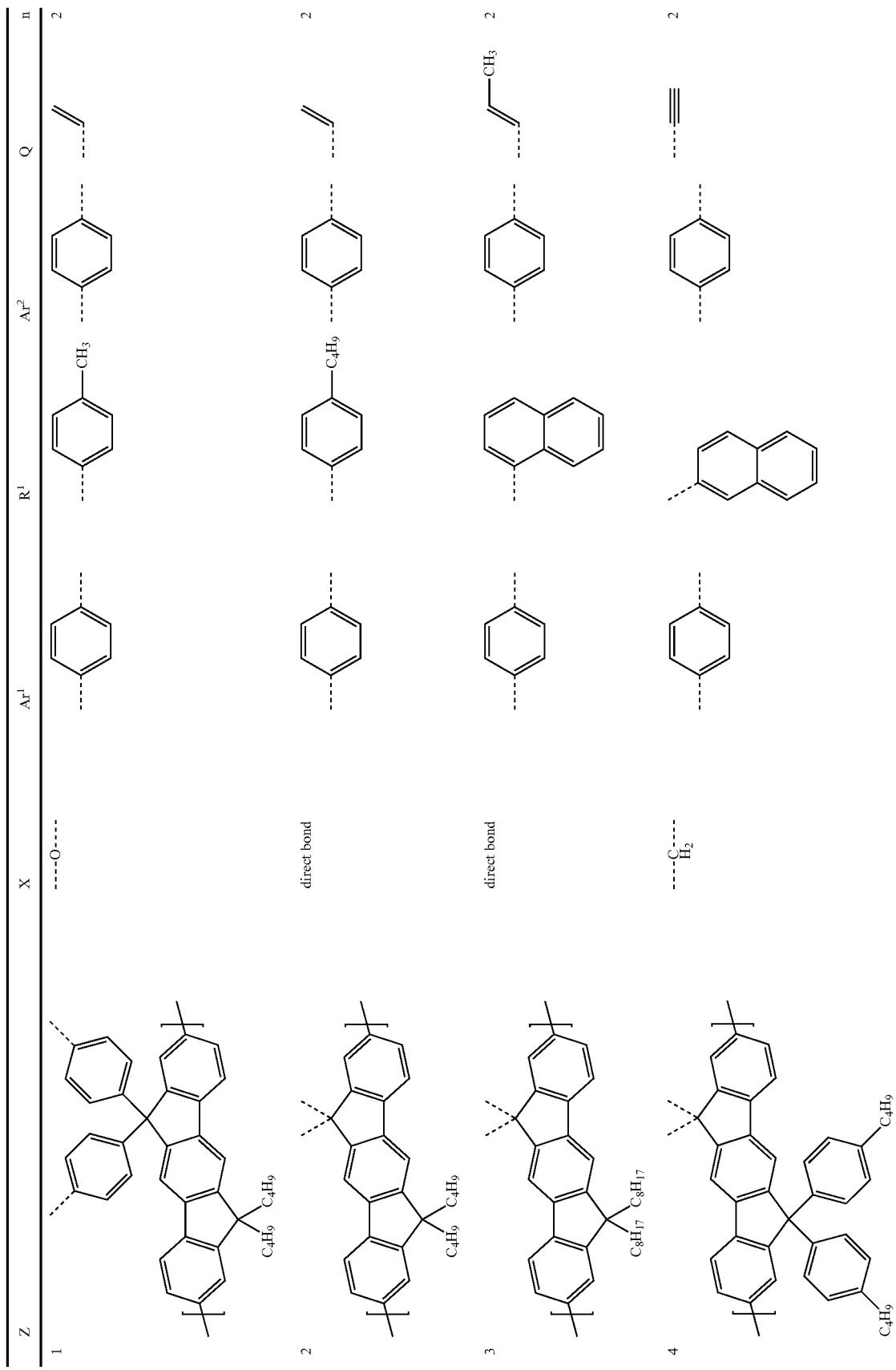

-continued

| Z | X | Ar¹ | R¹ | Ar² | Q | n |
|---|---|---|---|---|---|---|
| 5 (fluorene with C₈H₁₇, C₈H₁₇) | —CH₂—CH₂—O— | pyridine | phenyl-C₄H₉ | phenyl | vinyl | 2 |
| 6 (fluorene with C₈H₁₇, C₈H₁₇) | direct bond | N-carbazolyl-phenyl | phenyl-CH₃ | phenyl | vinyl | 2 |
| 7 (fluorene with C₈H₁₇, C₈H₁₇) | direct bond | phenyl | phenyl-CH₃ | pyridine | vinyl | 2 |
| 8 (fluorene with phenyl, C₄H₉, C₄H₉) | N—CH₃ | phenyl | phenyl-C₄H₉ | phenyl | vinyl | 1 |

-continued
| Z | X | Ar¹ | R¹ | Ar² | Q | n |
|---|---|---|---|---|---|---|
| 9 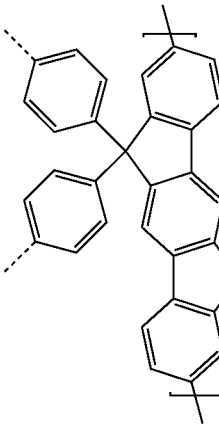 | —O— |  |  (CH₃) |  (CH₃, CH₃) |  | 2 |
| 10 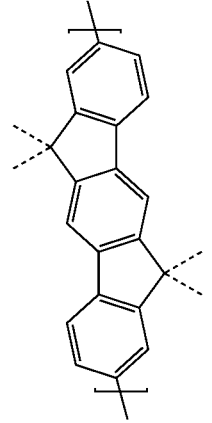 | direct bond |  |  (CH₃) |  |  (CH₃) | 4 |
| 11 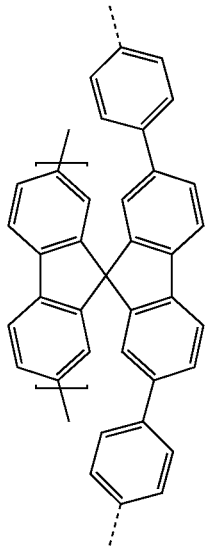 | direct bond |  |  (C₄H₉) |  |  | 2 |
| 12 | direct bond | | | | | 2 |

-continued

| Z | X | Ar¹ | R¹ | Ar² | Q | n |
|---|---|---|---|---|---|---|
| 13 (spirobifluorene with phenyl substituent) | direct bond | phenyl | 4-methylphenyl (tolyl) | pyridyl | epoxide (oxiranyl) | 2 |
| 14 (spirobifluorene) | direct bond | phenyl | 3,5-diphenylphenyl (m-terphenyl) | phenyl | vinyl (CH=CH₂) | 2 |
| 15 (spirobifluorene) | direct bond | phenyl | 3-phenyl-5-(2-pyridyl)phenyl | phenyl | propenyl (CH=CH–CH₃) | 2 |
| 16 (spirobifluorene) | N–CH₃ | phenyl | 4-methylphenyl (tolyl) | phenyl | propenyl (CH=CH–CH₃) | 2 |

-continued

| | Z | X | Ar¹ | R¹ | Ar² | Q | n |
|---|---|---|---|---|---|---|---|
| 17 | bis-fluorene (spirobifluorene) | -CH₂-CH₂-O- | anthracenyl | 4-C₄H₉-phenyl | phenylene | -CH=CH₂ | 2 |
| 18 | 9,9-dialkyl-fluorene | -CH₂- | phenylene | 4-C₄H₉-phenyl | phenylene | -C(CH₃)=CH₂ | 2 |
| 19 | carbazole | -CH₂- | phenylene | 4-CH₃-phenyl | phenylene | -CH=CH₂ | 1 |
| 20 | phenanthrene | -CH₂- | phenylene | 4-C₄H₉-phenyl | phenylene | -CH=CH₂ | 1 |
| 21 | phenyl-phenanthrene | -O- | phenylene | 4-CH₃-phenyl | phenylene | -CH=CH₂ | 1 |

-continued
| Z | X | Ar¹ | R¹ | Ar² | Q | n |
|---|---|---|---|---|---|---|
| 22  | direct bond |  |  C₄H₉ |  |  | 2 |
| 23  | direct bond |  |  CH₃ |  |  | 2 |
| 24  | direct bond |  |  CH₃ |  |  | 4 |
| 25 | —O— | |  CH₃ | |  | 1 |
| 26 | direct bond | | CH₃ | |  | 2 |

-continued
| Z | X | Ar¹ | R¹ | Ar² | Q | n |
|---|---|---|---|---|---|---|
| 27 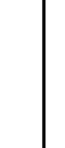 | direct bond | 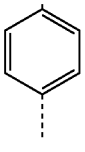 | 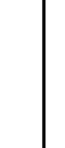 C₄H₉ | 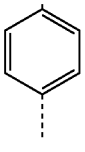 | | 2 |
| 28  | direct bond | 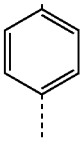 |  CH₃ | 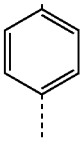 | | 4 |

A polymer in the sense of the present invention is also intended to be taken to mean an oligomer and a dendrimer.

For the purposes of the present invention, the term oligomer is applied to a compound which has three to nine recurring units. A polymer in the sense of the present invention is taken to mean a compound which has ten or more recurring units. The branching factor of the polymers here is between 0 (linear polymer, no branching points) and 1 (fully branched dendrimer).

The polymers, oligomers or dendrimers may be conjugated, partially conjugated or non-conjugated. The polymers or oligomers may be linear, branched or dendritic. In the structures linked in a linear manner, the units of the general formula I can either be linked directly to one another or they can be linked to one another via a divalent group, for example via a substituted or unsubstituted alkylene group, via a heteroatom or via a divalent aromatic or heteroaromatic group. In branched structures, for example, three or more units of the general formula I can be linked via a trivalent or polyvalent group, for example via a trivalent or polyvalent aromatic or heteroaromatic group, to form a branched polymer or oligomer.

The proportion of the structural unit of the general formula I in the polymer is in the range from 0.01 to 100 mol %, preferably in the range from 0.1 to 50 mol % and particularly preferably in the range from 0.5 to 30 mol %.

Besides one or more structural units of the general formula I, the polymers according to the invention may also contain further structural units. These are, inter alia, those as disclosed and listed extensively in WO 02/077060 A1 and in WO 2005/014689 A2. These are incorporated into the present invention by way of reference. The further structural units can originate, for example, from the following classes:

Group 1: units which enhance the hole-injection and/or hole-transport properties of the polymers;
Group 2: units which enhance the electron-injection and/or electron-transport properties of the polymers;
Group 3: units which have combinations of individual units from group 1 and group 2;
Group 4: units which modify the emission characteristics to such an extent that electrophosphorescence can be obtained instead of electrofluorescence;
Group 5: units which improve transfer from the so-called singlet state to the triplet state;
Group 6: units which influence the emission colour of the resultant polymers;
Group 7: units which are typically used as backbone;
Group 8: units which influence the film morphology and/or rheological properties of the resultant polymers.

Preferred polymers according to the invention are those in which at least one structural unit has charge-transport properties, i.e. which contain units from group 1 and/or 2.

Structural units from group 1 which have hole-injection and/or hole-transport properties are, for example, triarylamine, benzidine, tetraaryl-para-phenylenediamine, triarylphosphine, phenothiazine, phenoxazine, dihydrophenazine, thianthrene, dibenzo-para-dioxin, phenoxathiyne, carbazole, azulene, thiophene, pyrrole and furan derivatives and further O-, S- or N-containing heterocycles having a high HOMO (HOMO=highest occupied molecular orbital). These arylamines and heterocycles preferably result in an HOMO in the polymer of greater than −5.8 eV (against vacuum level), particularly preferably greater than −5.5 eV.

Structural units from group 2 which have electron-injection and/or electron-transport properties are, for example, pyridine, pyrimidine, pyridazine, pyrazine, oxadiazole, quinoline, quinoxaline, anthracene, benzanthracene, pyrene, perylene, benzimidazole, triazine, ketone, phosphine oxide and phenazine derivatives, but also triarylboranes and further O-, S- or N-containing heterocycles having a low LUMO (LUMO=lowest unoccupied molecular orbital). These units in the polymer preferably result in an LUMO of less than −2.5 eV (against vacuum level), particularly preferably less than −2.7 eV.

It may be preferred for the polymers according to the invention to contain units from group 3 in which structures which increase the hole mobility and structures which increase the electron mobility (i.e. units from groups 1 and 2) are bonded directly to one another or structures which increase both the hole mobility and the electron mobility. Some of these units can serve as emitters and shift the emission colour into the green, yellow or red. Their use is thus suitable, for example, for the generation of other emission colours from originally blue-emitting polymers.

Structural units from group 4 are those which are able to emit light from the triplet state with high efficiency, even at room temperature, i.e. exhibit electrophosphorescence instead of electrofluorescence, which frequently causes an increase in the energy efficiency. Suitable for this purpose are firstly compounds which contain heavy atoms having an atomic number of greater than 36. Preference is given to compounds which contain d- or f-transition metals which satisfy the above-mentioned condition. Particular preference is given here to corresponding structural units which contain elements from groups 8 to 10 (Ru, Os, Rh, Ir, Pd, Pt). Suitable structural units for the polymers according to the invention here are, for example, various complexes, as described, for example, in WO 02/068435 A1, WO 02/081488 A1, EP 1239526 A2 and WO 04/026886 A2. Corresponding monomers are described in WO 02/068435 A1 and in WO 05/042548 A1.

Structural units from group 5 are those which improve transfer from the singlet state to the triplet state and which, employed in support of the structural elements from group 4, improve the phosphorescence properties of these structural elements. Suitable for this purpose are, in particular, carbazole and bridged carbazole dimer units, as described, for example, in WO 04/070772 A2 and WO 04/113468 A1. Also suitable for this purpose are ketones, phosphine oxides, sulfoxides, sulfones, silane derivatives and similar compounds, as described, for example, in WO 05/040302 A1.

Structural units from group 6, besides those mentioned above, are those which have at least one further aromatic structure or another conjugated structure which does not fall under the above-mentioned groups, i.e. which have only little influence on the charge-carrier mobilities, are not organometallic complexes or do not influence singlet-triplet transfer. Structural elements of this type can influence the emission colour of the resultant polymers. Depending on the unit, they can therefore also be employed as emitters. Preference is given here to aromatic structures having 6 to 40 C atoms and also tolan, stilbene or bisstyrylarylene derivatives, each of which may be substituted by one or more radicals R. Particular preference is given here to the incorporation of 1,4-phenylene, 1,4-naphthylene, 1,4- or 9,10-anthrylene, 1,6-, 2,7- or 4,9-pyrenylene, 3,9- or 3,10-perylenylene, 4,4'-biphenylylene, 4,4"-terphenylylene, 4,4'-bi-1,1'-naphthylylene, 4,4'-tolanylene, 4,4'-stilbenzylene, 4,4"-bisstyrylarylene, benzothiadiazole and corresponding oxygen derivatives, quinoxaline, phenothiazine, phenoxazine, dihydrophenazine, bis(thiophenyl)arylene, oligo(thiophenylene), phenazine, rubrene, pentacene or perylene derivatives, which are preferably substituted, or preferably conjugated push-pull systems (systems which are substituted by donor and acceptor substituents) or systems such as squarines or quinacridones, which are preferably substituted.

Structural units from group 7 are units which contain aromatic structures having 6 to 40 C atoms, which are typically used as polymer backbone. These are, for example, 4,5-dihydropyrene derivatives, 4,5,9,10-tetrahydropyrene derivatives, fluorene derivatives, 9,9'-spirobifluorene derivatives, phenanthrene derivatives, 9,10-dihydrophenanthrene derivatives, 5,7-dihydrodibenzoxepine derivatives and cis- and trans-indenofluorene derivatives.

Structural units from group 8 are those which influence the film morphology and/or rheological properties of the polymers, such as, for example, siloxanes, long alkyl chains or fluorinated groups, but also particularly rigid or flexible units, such as, for example, liquid crystal-forming units or crosslinkable groups.

Preference is given to polymers according to the invention which, besides the structural units of the general formula I, at the same time additionally contain one or more units selected from groups 1 to 8 which are different from the structural units according to the invention. It may likewise be preferred for more than one structural unit from one group to be present at the same time.

Preference is given here to polymers according to the invention which, besides at least one structural unit of the general formula I, also contain units from group 7, particularly preferably at least 50 mol % of these units, based on the total number of structural units in the polymer.

It is likewise preferred for the polymers according to the invention to contain units which improve the charge transport or charge injection, i.e. units from group 1 and/or 2; a proportion of 0.5 to 30 mol % of these units is particularly preferred; a proportion of 1 to 10 mol % of these units is very particularly preferred.

It is furthermore particularly preferred for the polymers according to the invention to contain structural units from group 7 and units from group 1 and/or 2, in particular at least 50 mol % of units from group 7 and 0.5 to 30 mol % of units from group 1 and/or 2.

The polymers according to the invention are either homopolymers comprising recurring units, i.e. structural units of the general formula I, or copolymers. The polymers according to the invention may be linear or branched. Besides one or more structural units of the general formula I or preferred sub-formulae thereof, copolymers according to the invention may potentially have one or more further structures from groups 1 to 8 given above.

The crosslinkable polymer, oligomer or dendrimer can be applied to a corresponding support substrate (glass, polymer, etc.) or a layer already deposited in advance by coating from solution and crosslinked either before or after removal of the solvent. The crosslinkable group Q on the aromatic ring system, in particular the vinyl group, has adequate reactivity, meaning that less high-energy UV radiation or a smaller amount of thermal energy is necessary for the crosslinking. The crosslinking reaction is thus gentler for the polymer layer than the crosslinking processes known from the prior art using high-energy radiation or thermal energy (usually above 200° C.). However, the polymer according to the invention also has high stability, meaning that the formation of undesired by-products, which could adversely affect the electro-optical properties, does not occur in crosslinking methods in accordance with the prior art, or only does so to a lesser extent.

The present invention furthermore relates to the monomers employed for the preparation of the polymers according to the invention.

To this end, the invention provides a compound of the general formula II,

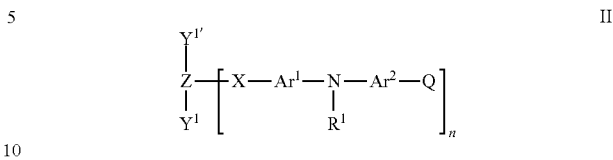

where
Z is an aromatic or heteroaromatic ring system, which may be substituted by one or more radicals R of any desired type,
$Y_1$, $Y_1'$ are each leaving groups, which may be identical or different,
X is a spacer group or a direct bond,
$Ar^1$, $Ar^2$ are an aryl or heteroaryl group, which may be substituted by one or more radicals R of any desired type or may be linked to one another,
Q is a crosslinkable group,
$R^1$ is a straight-chain alkyl, alkoxy or thioalkoxy group having 1 to 40 C atoms or a branched or cyclic alkyl, alkoxy or thioalkoxy group having 3 to 40 C atoms or a silyl group or substituted keto group having 1 to 40 C atoms, or a substituted or unsubstituted aromatic or heteroaromatic ring system having 5 to 60 ring atoms, or an aryloxy or heteroaryloxy group having 5 to 60 ring atoms, or a combination of these systems, or is $Ar^2$, where one or more H atoms may be replaced by fluorine, and
n is 1, 2, 3 or 4.

In the compound of the general formula II, $Ar^1$ and $Ar^2$ are each, independently of one another, an aryl or heteroaryl group having 5 to 60 ring atoms, which may be substituted by one or more radicals R of any desired type.

For the purposes of the present invention, the radicals $Ar^1$ and $Ar^2$ in the general formula II are each particularly preferably derived, independently of one another, from benzene, naphthalene, pyridine, anthracene, phenanthrene, pyrimidine, pyrazine, pyridazine, quinoline, isoquinoline, furan, thiophene, pyrrole, benzofuran, benzothiophene and indole, where benzene, naphthalene, pyridine, anthracene, phenanthrene, quinoline and isoquinoline are particularly preferred.

In a preferred embodiment of the invention, $Ar^1$ is a 1,4-linked aryl or heteroaryl group, which may be substituted by one or more radicals R of any desired type.

In the compound of the general formula II, it is furthermore preferred for R to be selected on each occurrence, independently of one another, from F, Cl, Br, I, $N(Ar)_2$, $N(R^2)_2$, CN, $NO_2$, $Si(R^2)_3$, $B(OR^2)_2$, $C(=O)Ar$, $C(=O)R^2$, $P(=O)(Ar)_2$, $P(=O)(R^2)_2$, $S(=O)Ar$, $S(=O)R^2$, $S(=O)_2Ar$, $S(=O)_2R^2$, $-CR^2=CR^2Ar$, $OSO_2R^2$, a straight-chain alkyl, alkoxy or thioalkoxy group having 1 to 40 C atoms or a branched or cyclic alkyl, alkoxy or thioalkoxy group having 3 to 40 C atoms, each of which may be substituted by one or more radicals $R^2$, where one or more non-adjacent $CH_2$ groups may be replaced by $R^2C=CR^2$, $C\equiv C$, $Si(R^2)_2$, $Ge(R^2)_2$, $Sn(R^2)_2$, $C=O$, $C=S$, $C=Se$, $C=NR^2$, $P(=O)(R^2)$, SO, $SO_2$, $NR^2$, O, S or $CONR^2$ and where one or more H atoms may be replaced by F, Cl, Br, I, CN or $NO_2$, or an aromatic or heteroaromatic ring system having 5 to 60 ring atoms, which may in each case be substituted by one or more radicals $R^2$, or an aryloxy or heteroaryloxy group having 5 to 60 ring atoms, which may be substituted by one or more radicals $R^2$, or a combination of these systems, where two or more substituents R may also form a mono- or polycyclic, aliphatic or aromatic ring system with one another, where $R^2$ is in each case, independently of one another, H or an aliphatic or aromatic hydrocarbon radical having 1 to 20 C atoms.

The leaving groups $Y^1$ and $Y^{1'}$ are each, independently of one another, identically or differently, leaving groups, which are preferably accessible to a metal-catalysed cross-coupling reaction. The compounds functionalised by means of the leaving groups represent the basis for a polymerisation. Thus, bromine derivatives can be reacted with arylboronic acids or arylboronic acid derivatives in a Suzuki coupling or with organotin compounds by the Stille method to give the corresponding polymers, oligomers or dendrimers.

These processes are known from the prior art. Thus, the Suzuki coupling is, for example, a cross-coupling reaction, for example for the formation of diphenyl derivatives, where arylboronic acids are preferably reacted with haloaromatic compounds, preferably using palladium/phosphine complexes as catalyst. The reactivity of the aromatic compounds increases from bromine via trifluoromethanesulfonate to iodine, where even weakly reactive chloroaromatic compounds can in the meantime be reacted using palladium/phosphine catalysts. The Stille cross-coupling reaction proceeds analogously, using organotin compounds instead of organoboron compounds, but these are not preferred owing to their high toxicity.

$Y^1$ and $Y^{1'}$ are preferably each selected, independently of one another, from halide, boric acid, boric acid ester, borane, mesitylate and triflate. The halide here is preferably F, Cl, Br, I, particularly preferably Br.

The invention furthermore relates to a process for the preparation of a compound of the general formula II

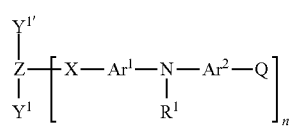

as defined above, where reactive leaving groups $Y^1$, $Y^{1'}$ and one or more radicals

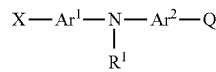

are introduced into a parent structure Z, where the symbols and indices have the meanings indicated above. Q is particularly preferably a vinyl or alkenyl group.

It is independent of the reaction route here whether, for example, firstly $Y^1$ and $Y^{1'}$ and then the radical carrying the crosslinkable group are introduced into the parent structure Z or vice versa. There are a number of standard methods of organic chemistry for the introduction of the radicals $Y^1$ or $Y^{1'}$. In the case where $Y^1$ and/or $Y^{1'}$ denote bromine, this can be carried out, for example, by bromination using $Br_2$ or, for example, NBS (N-bromosuccinimide). In this way, for example, a mono- or dibromination can also be controlled selectively. The introduction of the radical, i.e. the coupling of X or $Ar^1$ to Z, can also be carried out by standard methods of organic chemistry. Alternatively, it is also conceivable, for example, firstly to polymerise the parent structure Z substituted by $Y^1$ and $Y^{1'}$ and subsequently to graft the radical onto the main polymer chain either via X or directly via $Ar^1$.

The invention furthermore relates to the use of a compound of the general formula II, as defined above, for the preparation of a crosslinkable or crosslinked polymer, which also includes oligomers and dendrimers.

The invention still furthermore relates to a process for the preparation of a polymer, oligomer or dendrimer in which a compound of the general formula II, as defined above, is reacted in a metal-catalysed cross-coupling reaction.

The leaving groups $Y^1$ and $Y^{1'}$ can be used for polymerisation of the compounds of the general formula II to give the polymer, oligomer or dendrimer. To this end, compounds which are substituted by reactive leaving groups, such as bromine, iodine, boronic acid or boronic acid ester, are particularly preferred. These can also be used as comonomers for the production of corresponding conjugated, partially conjugated or non-conjugated polymers, oligomers or also as the core of dendrimers. The polymerisation here is preferably carried out via the halogen functionality or the boronic acid functionality.

For the preparation of the polymers, oligomers or dendrimers, the functionalised compounds of the general formula II are homopolymerised or copolymerised with further monomers. Suitable polymerisation reactions are known to the person skilled in the art and are described in the literature. Particularly suitable and preferred polymerisation and coupling reactions, all of which result in C—C links, are those in accordance with SUZUKI, YAMAMOTO, STILLE, HECK, NEGISHI, SONOGASHIRA or HIYAMA.

The C—C linking reactions are particularly preferably carried out via a SUZUKI coupling, YAMAMOTO coupling or STILLE coupling.

The way in which the polymerisation can be carried out by these methods and the way in which the polymers can then be separated off from the reaction medium and purified are known to the person skilled in the art and are described in detail in the literature, for example in WO 03/048225 and WO 04/037887.

If copolymers are prepared, it is particularly preferred for the compound of the general formula II to be present in an amount in the range from 0.5 to 30 mol %. Suitable and preferred comonomers are selected from fluorenes (for example in accordance with EP 842208 or WO 00/22026), spirobifluorenes (for example in accordance with EP 707020, EP 894107 or WO 06/061181), para-phenylenes (for example in accordance with WO 92/18552), carbazoles (for example in accordance with WO 04/070772 or WO 04/113468), thiophenes (for example in accordance with EP 1028136), dihydrophenanthrenes (for example in accordance with WO 05/014689), cis- and trans-indenofluorenes (for example in accordance with WO 04/041901 or WO 04/113412), ketones (for example in accordance with WO 05/040302), phenanthrenes (for example in accordance with WO 05/104264 or DE 102005037734), benzanthrenes, benzanthracenes or also a plurality of these units. These polymers usually also contain further units, for example emitting (fluorescent or phosphorescent) units or phosphorescent metal complexes (for example in accordance with WO 06/003000), and/or charge-transport units, in particular those based on triarylamines. Particular preference is given to monomers which have structural units selected from groups 1 to 8 mentioned above.

Polymers, oligomers or dendrimers which contain the structural units according to the invention are used, for example, for the production of OLEDs or PLEDs, preferably as emitter layer, electron-transport layer, electron-injection layer, hole-injection layer and/or hole-transport layer. The polymer layer can be produced, for example, by coating from solution, preferably spin coating. After application of the polymer layer and removal of the solvent, the polymer can be crosslinked. The crosslinking is preferably carried out with radiation induction (for example using UV light, visible light, microwaves, electron beams) or thermally, preferably at temperatures of less than 200° C.

The invention also relates to the use of the polymers, oligomers or dendrimers in an organic, electronic device.

The organic, electronic device is preferably an organic electroluminescent device (OLED), a polymeric electroluminescent device (PLED), an organic integrated circuit (O-IC), an organic field-effect transistor (O-FET), an organic thin-film transistor (O-TFT), an organic light-emitting transistor (O-LET), an organic solar cell (O-SC), an organic optical detector, an organic photoreceptor, an organic field-quench device (O-FQD), a light-emitting electrochemical cell (LEC) or an organic laser diode (O-laser).

For the purposes of the present invention, it is preferred for the polymer, oligomer or dendrimer according to the invention to be in the form of a layer (or to be present in a layer) in the electronic device.

The present invention thus also relates to a layer, in particular an organic layer, comprising one or more polymers, oligomers or dendrimers, as defined above.

It is furthermore preferred for the polymer, oligomer or dendrimer to be crosslinked.

The polymers and copolymers may furthermore be linear or branched. The copolymers according to the invention may have random, alternating or block-like structures or have a plurality of these structures in an alternating arrangement. The way in which copolymers having block-like structures can be obtained and which further structural elements are particularly preferred for this purpose are described in detail, for example, in WO 05/014688. This specification is incorporated into the present application by way of reference.

In a further embodiment of the present invention, the device encompasses a plurality of layers. The polymer, oligomer or dendrimer according to the invention can be present here in the form of a hole-transport, hole-injection, emitter, electron-transport, electron-injection, charge-blocking and/or charge-generation layer.

The device may furthermore comprise layers built up from small molecules (SMOLED). These can be generated by evaporation of small molecules in a high vacuum.

It may additionally be preferred to use the polymer not as the pure substance, but instead as a mixture (blend) together with further polymeric, oligomeric, dendritic or low-molecular-weight substances of any desired type. These may, for example, improve the electronic properties or emit themselves. The present invention therefore also relates to blends of this type.

In a preferred embodiment of the present invention, the polymers, oligomers or dendrimers according to the invention are employed as emitting compounds in an emitting layer. The organic electroluminescent device here may comprise one emitting layer or a plurality of emitting layers, where at least one emitting layer comprises or consists of at least one polymer, oligomer or dendrimer according to the invention, as defined above. If a plurality of emission layers are present, these preferably have in total a plurality of emission maxima between 380 nm and 750 nm, resulting overall in white emission, i.e. various emitting compounds which are able to fluoresce or phosphoresce are used in the emitting layers. Particular preference is given to three-layer systems, where the three layers exhibit blue, green and orange or red emission (for the basic structure see, for example, WO 05/011013). White-emitting devices are suitable, for example, as lighting or backlighting of displays (LCDs).

Apart from these layers, the organic electroluminescent device may also comprise further layers, for example in each case one or more hole-injection layers, hole-transport layers, hole-blocking layers, electron-transport layers, electron-injection layers, exciton-blocking layers and/or charge-generation layers (IDMC 2003, Taiwan; Session 21 OLED (5), T. Matsumoto, T. Nakada, J. Endo, K. Mori, N. Kawamura, A. Yokoi, J. Kido, *Multiphoton Organic EL Device Having Charge Generation Layer*). Likewise, interlayers which have, for example, an exciton-blocking function may be introduced between two emitting layers. However, it should be pointed out that each of these layers does not necessarily have to be present. These layers may likewise comprise the polymers, oligomers or dendrimers according to the invention, as defined above. It is also possible for a plurality of OLEDs to be arranged one above the other, enabling a further increase in efficiency with respect to the light yield to be achieved. In order to improve the coupling-out of light, the final organic layer on the light-exit side in OLEDs can, for example, also be in the form of a nanofoam, resulting in a reduction in the proportion of total reflection.

Preference is furthermore given to an organic electroluminescent device in which one or more layers are applied by means of a sublimation process, in which the materials are applied by vapour deposition in vacuum sublimation units at a pressure below $10^{-5}$ mbar, preferably below $10^{-6}$ mbar, particularly preferably below $10^{-7}$ mbar.

Preference is likewise given to an organic electroluminescent device which is characterised in that one or more layers are applied by means of the OVPD (organic vapour phase deposition) process or with the aid of carrier-gas sublimation, in which the materials are applied at a pressure between $10^{-5}$ mbar and 1 bar.

Preference is furthermore given to an organic electroluminescent device which is characterised in that one or more layers are produced from solution, such as, for example, by spin coating, or by means of any desired printing process, such as, for example, screen printing, flexographic printing or offset printing, but particularly preferably LITI (light induced thermal imaging, thermal transfer printing) or ink-jet printing. Soluble compounds, which are obtained, if necessary, by suitable substitution, are necessary for this purpose.

Correspondingly, the present invention furthermore relates to a formulation comprising a polymer, oligomer or dendrimer, as defined above, which has structural units of the general formula I, in one or more solvents. The way in which formulations of this type can be prepared is known to the person skilled in the art and is described, for example, in WO 02/072714, WO 03/019694 and the literature cited therein.

Suitable and preferred solvents are, for example, toluene, anisole, xylenes, methyl benzoate, dimethylanisoles, mesitylenes, tetralin, veratrol, tetrahydrofuran and chlorobenzene, and mixtures thereof.

The device usually comprises a cathode and an anode (electrodes). The electrodes (cathode, anode) are selected for the purposes of the present invention in such a way that their potential corresponds as closely as possible to the potential of the adjacent, organic layer in order to ensure highly efficient electron or hole injection.

The cathode preferably comprises metal complexes, metals having a low work function, metal alloys or multilayered structures comprising various metals, such as, for example, alkaline-earth metals, alkali metals, main-group metals or lanthanoids (for example Ca, Ba, Mg, Al, In, Mg, Yb, Sm, etc.). In the case of multilayered structures, further metals which have a relatively high work function, such as, for example, Ag, can also be used in addition to the said metals, in which case combinations of the metals, such as, for example, Ca/Ag or Ba/Ag, are generally used. It may also be preferred to introduce a thin interlayer of a material having a high dielectric constant between a metallic cathode and the organic semiconductor. Suitable for this purpose are, for example, alkali-metal or alkaline-earth metal fluorides, but also the corresponding oxides (for example LiF, $Li_2O$, $BaF_2$, MgO, NaF, etc.). The layer thickness of this layer is preferably between 1 and 10 nm, particularly preferably between 2 and 8 nm.

The anode preferably comprises materials having a high work function. The anode preferably has a potential greater than 4.5 eV vs. vacuum. Suitable for this purpose are on the one hand metals having a high redox potential, such as, for example, Ag, Pt or Au. On the other hand, metal/metal oxide electrodes (for example $Al/Ni/NiO_x$, $Al/PtO_x$) may also be preferred. For some applications, at least one of the electrodes must be transparent in order to facilitate either irradiation of the organic material (O-SCs) or the coupling-out of light (OLEDs/PLEDs, O-lasers). A preferred structure uses a transparent anode. Preferred anode materials here are conductive, mixed metal oxides. Particular preference is given to indium tin oxide (ITO) or indium zinc oxide (IZO). Preference is furthermore given to conductive, doped organic materials, in particular conductive, doped polymers, such as, for example, poly(ethylenedioxythiophene) (PEDOT) and polyaniline (PANT).

The device is correspondingly structured, provided with contacts and finally hermetically sealed in a manner known per se, depending on the application, since the lifetime of such devices is drastically shortened in the presence of water and/or air.

The invention is explained in greater detail below with reference to working examples, but without being restricted thereby.

EXAMPLES

A) Preparation of the Monomers

Example 1

Preparation of Monomer 1

The preparation of monomer 1 follows Scheme 1 depicted below. The reactions in the individual steps are carried out in accordance with general methods of organic chemistry which are known to the person skilled in the art. The reaction conditions here are selected in accordance with the respective reaction with respect to reaction duration, temperature, pressure and the like in such a way that a maximum product yield is achieved in the individual steps. The courses of reactions can be monitored, for example, by thin-layer chromatography.

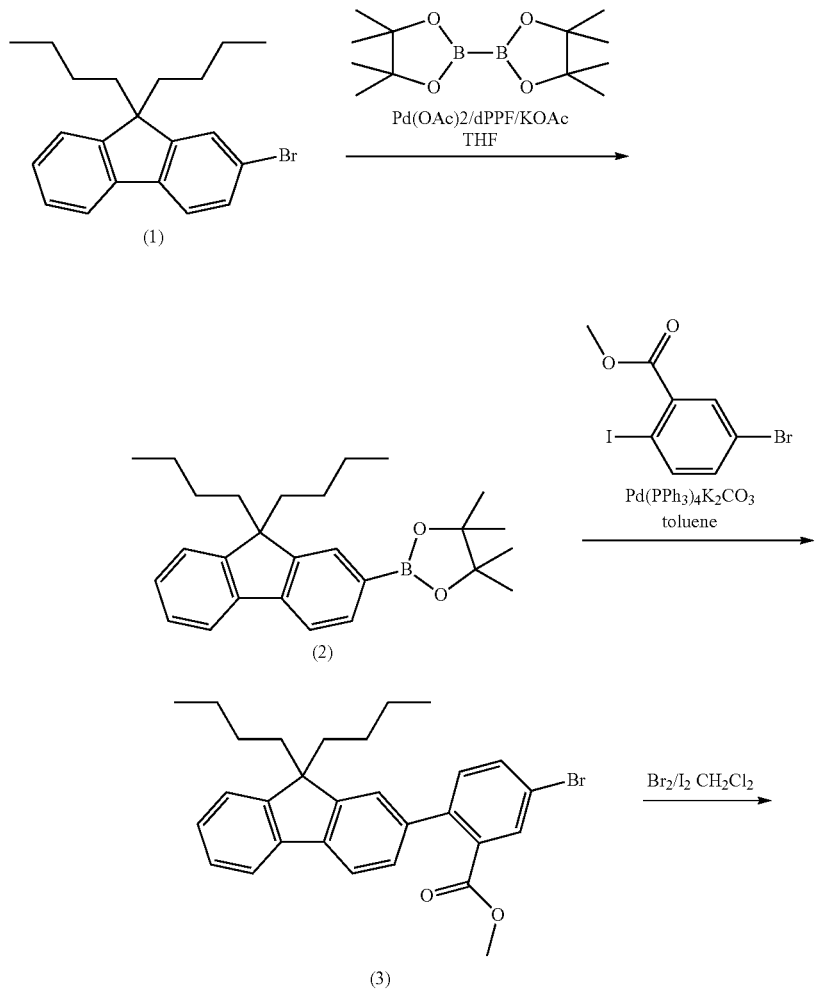

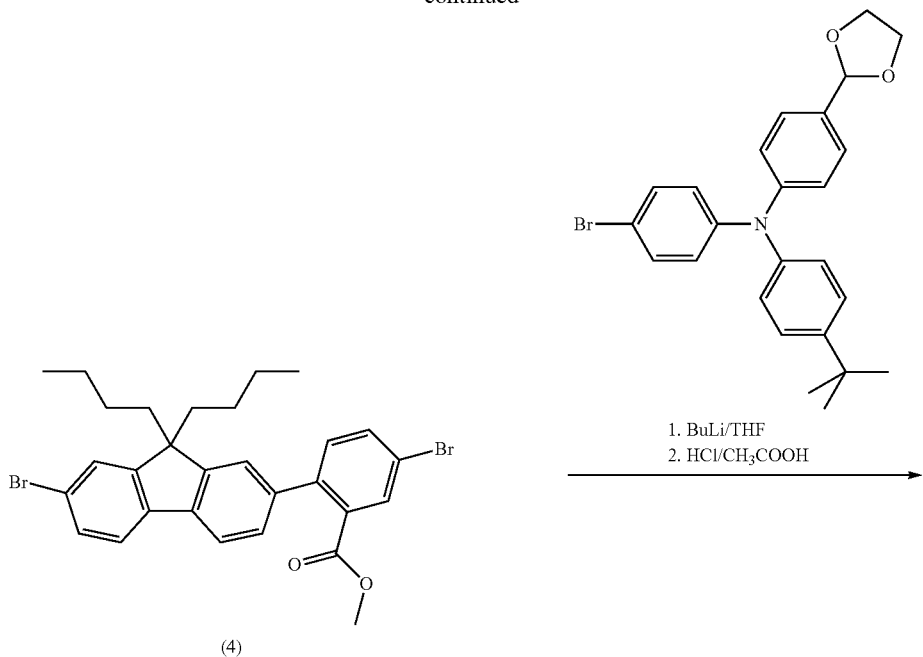
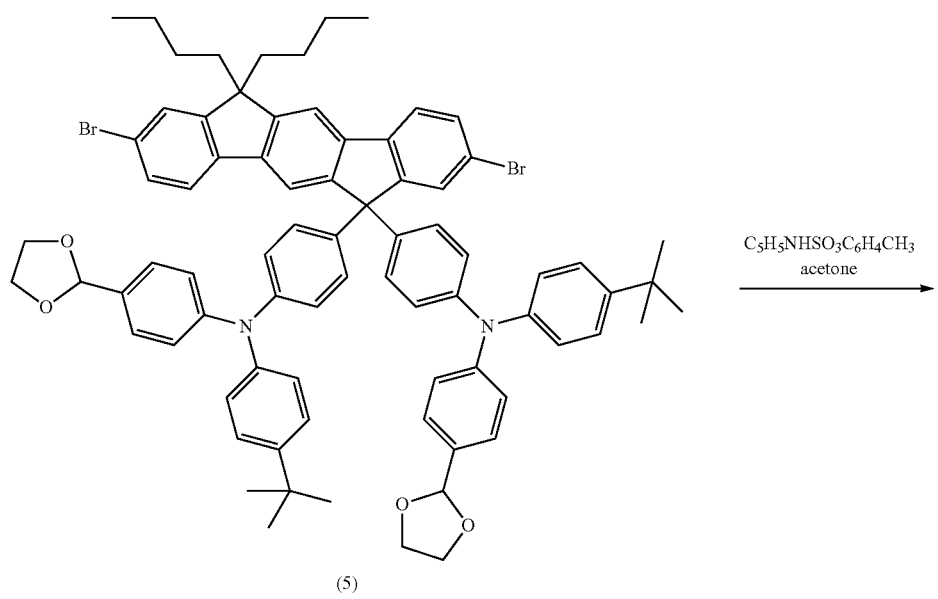

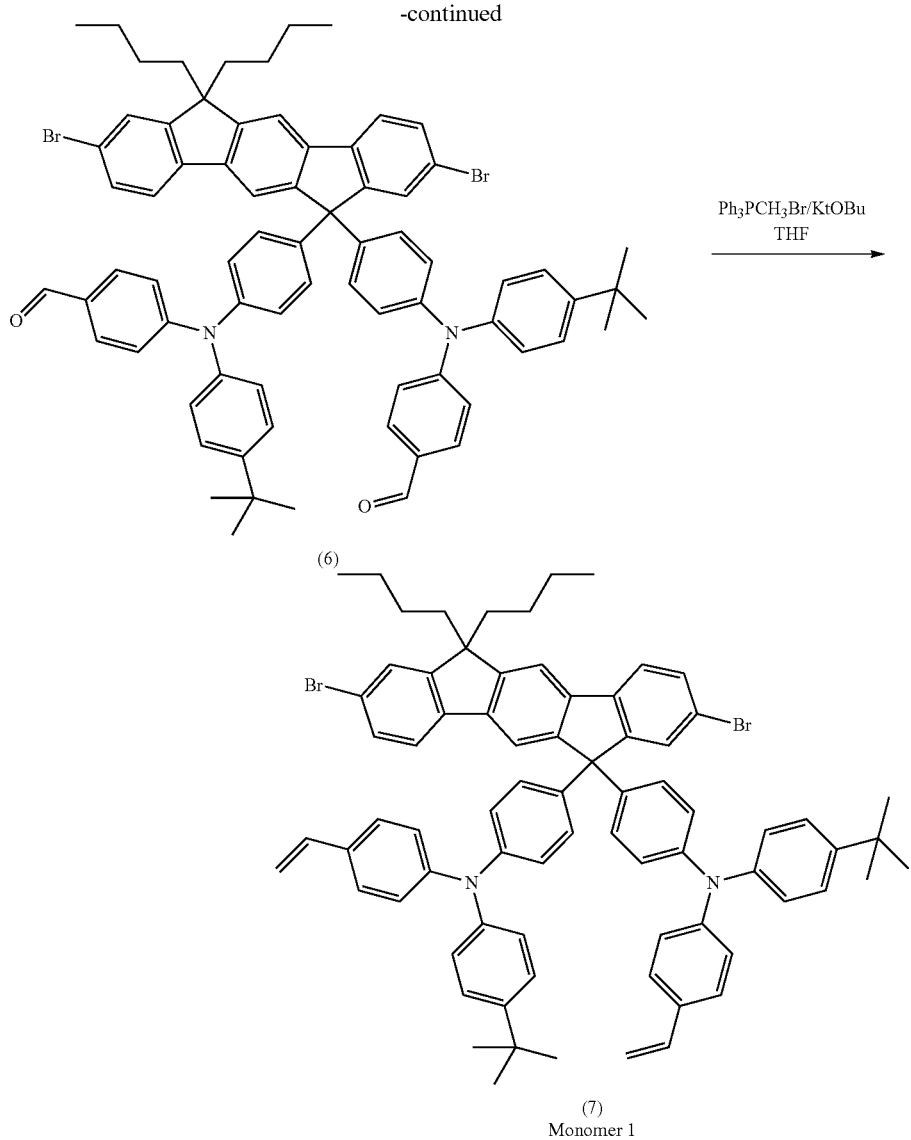
(6)
(7)
Monomer 1
Example 2
Preparation of Monomer 2
The preparation of monomer 2 is carried out in accordance with Scheme 2 depicted below. The reactions in the individual steps are carried out, as mentioned under Example 1, in accordance with general methods of organic chemistry which are known to the person skilled in the art.
Scheme 2
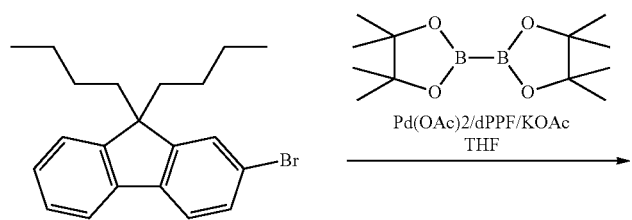

-continued
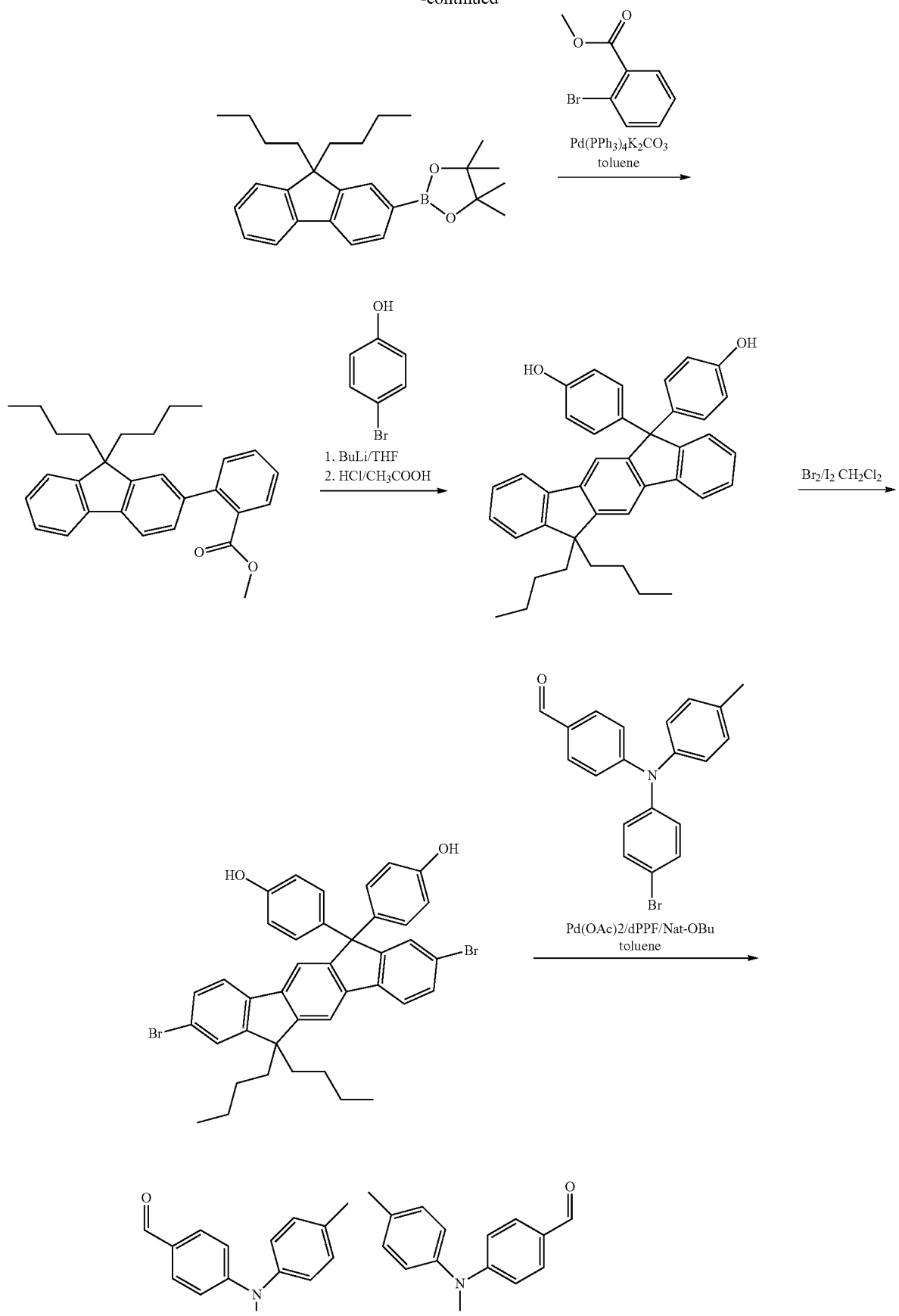

-continued

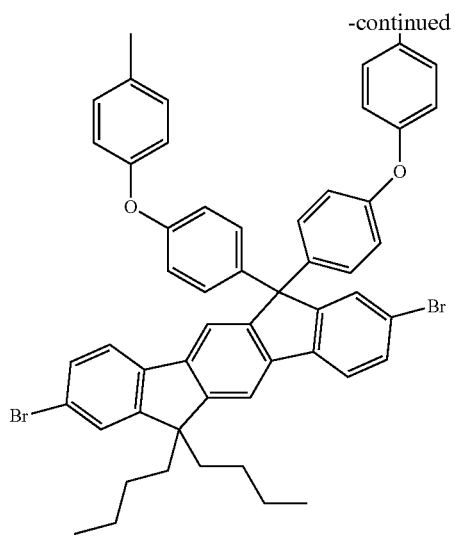

Ph₃PCH₃Br/KtOBu
THF
→

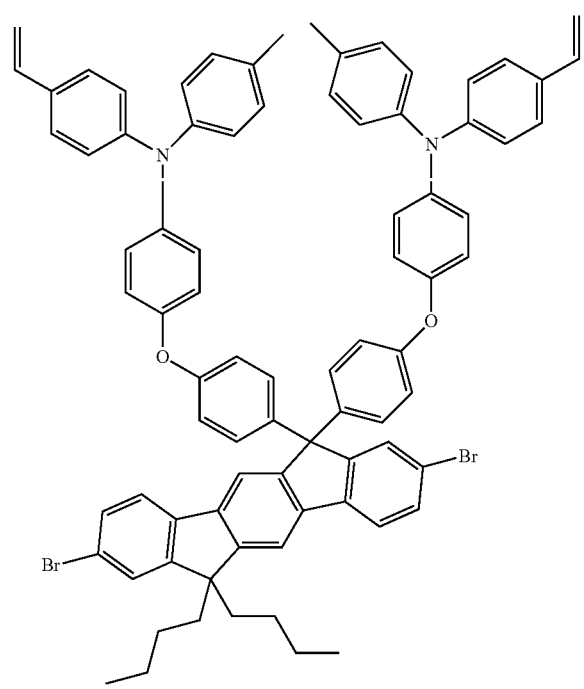

Monomer 2

B) Preparation of the Polymers

Examples 3 to 6

Preparation of Polymers P1 to P3 According to the Invention and Comparative Polymer C1

Polymers P1 to P3 according to the invention and comparative polymer C1 are synthesised by SUZUKI coupling in accordance with WO 03/048225. The monomer units employed for the synthesis of polymers P1 to P3 and comparative polymer C1 correspond to the monomers indicated below with the percentage proportions mentioned, which can be recovered essentially unchanged in the corresponding polymers.

Polymer P1:

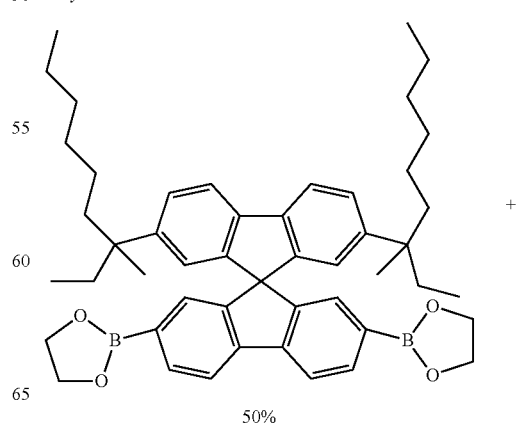

50%

+

39
-continued
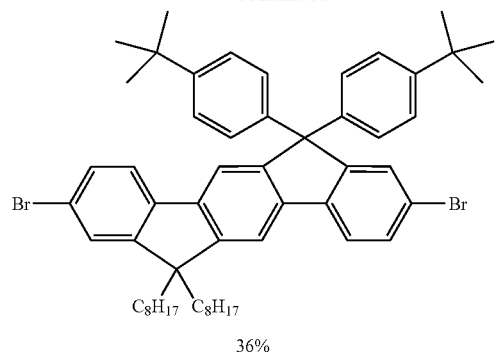
36%
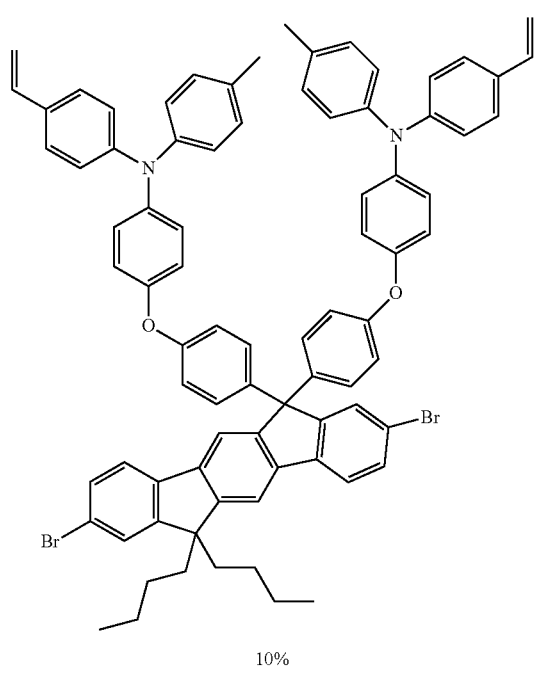
10%
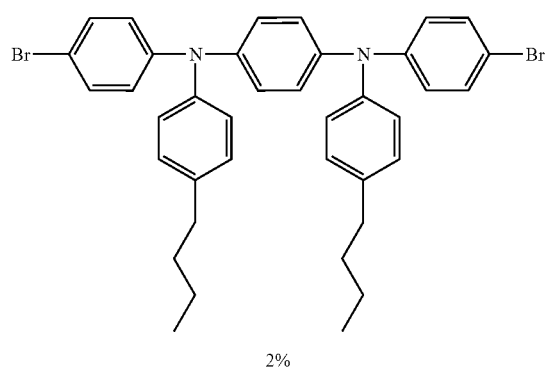
2%
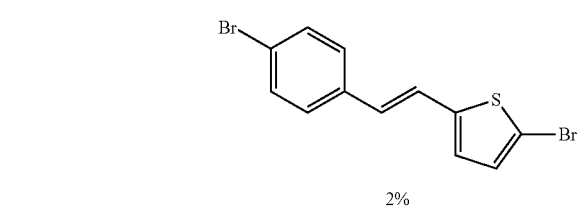
2%
40
-continued
Polymer P2:
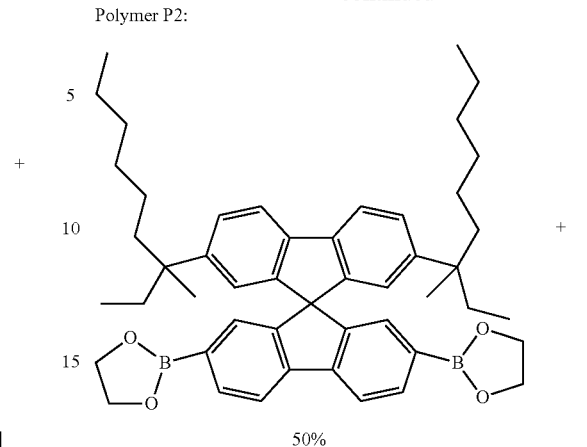
50%
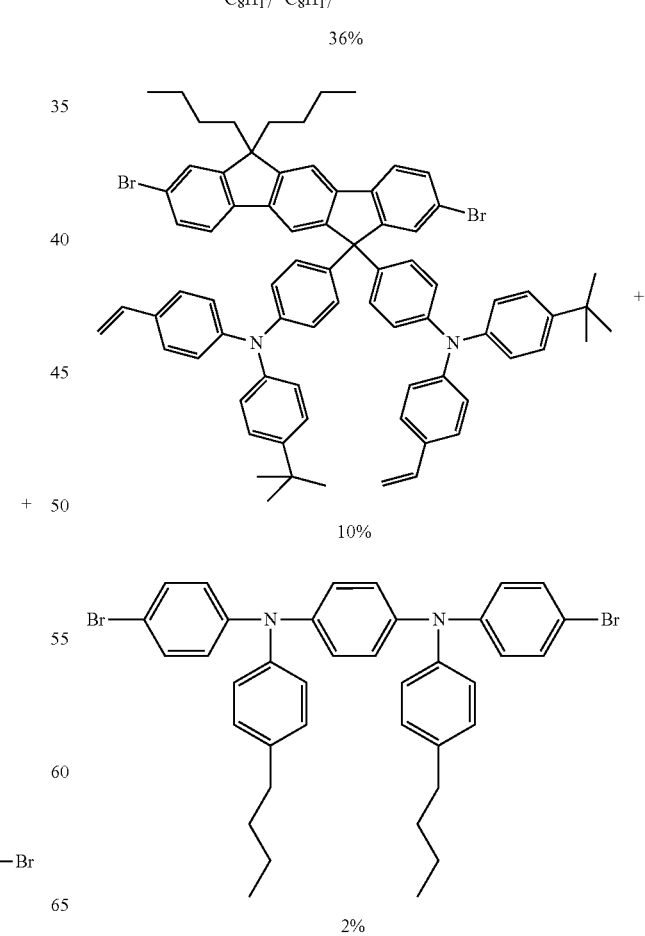
36%
10%
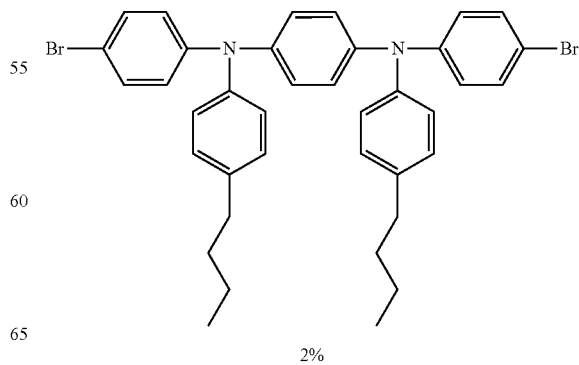
2%

-continued

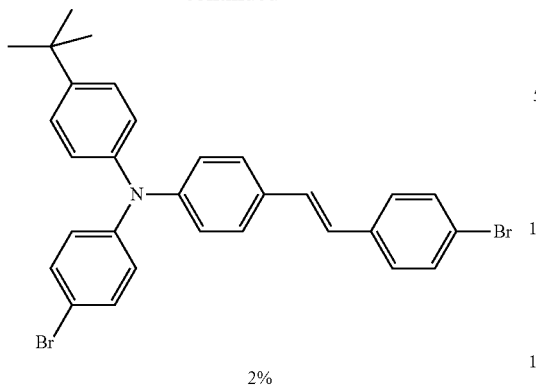

2%

Polymer P3:

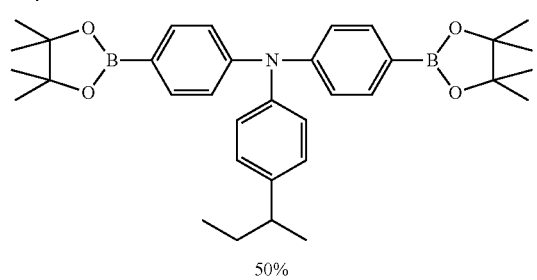

50%

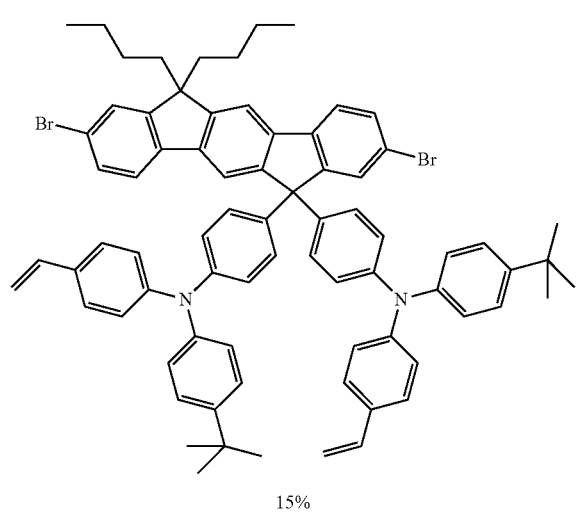

35%

15%

-continued

Comparative polymer C1:

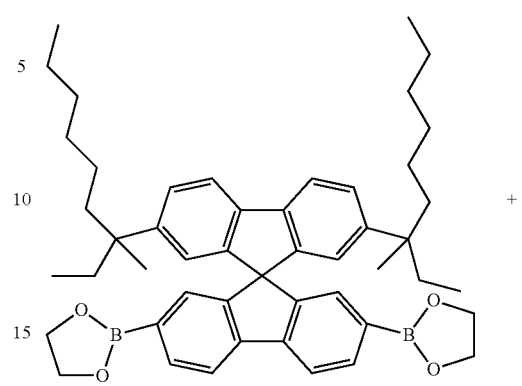

50%

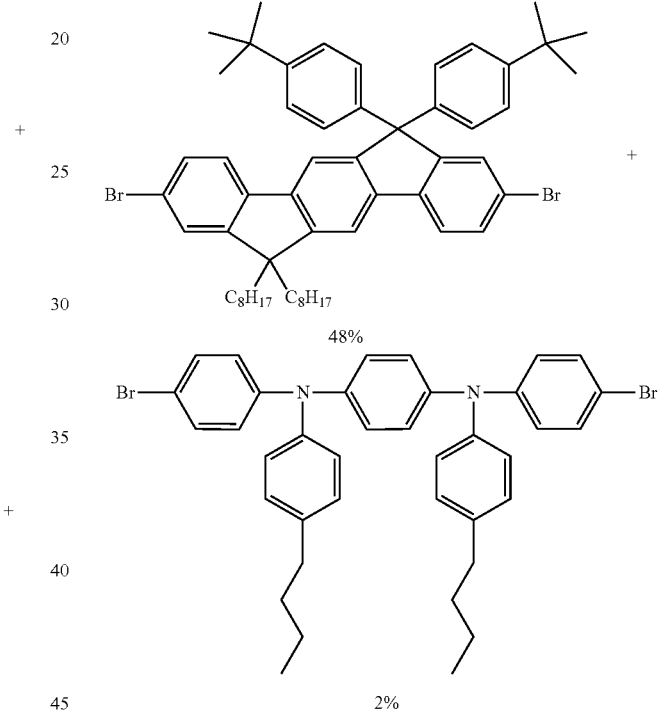

48%

2%

C) Preparation of Polymeric Light-Emitting Diodes (PLEDs)

Examples 7 to 10

The production of a polymeric light-emitting diode (PLED) has already been described a number of times in the patent literature (for example in WO 04/037887). In order to explain the present invention by way of example, PLEDs are produced with polymers P1 to P3 and comparative polymer C1 by spin coating on ITO substrate coated in advance with PEDOT and a hole-injecting interlayer (PEDOT is a polythiophene derivative (Baytron P, from H. C. Starck, Goslar)). The layer thickness of the polymer layer is about 65 nm. Polymers P1 to P3 are heated at 180° C. for a further hour after spin-coating in order to crosslink the polymer. A Ba/Al cathode (metals from Aldrich) is then applied by vapour deposition, and the PLEDs are encapsulated and characterised electro-optically.

The results obtained on use of polymers P1 to P3 and C1 in PLEDs are summarised in Table 1.

As can be seen from the results, the efficiency of the polymers according to the invention is better than that of the comparative polymer. The lifetimes are significantly improved. This shows that the polymers according to the invention are more suitable for use in OLEDs than are polymers in accordance with the prior art.

For polymer P3, no device data are given since this functions as interlayer and not as emitter layer.

TABLE 1

| Ex. | Polymer | Max. eff. [Cd/A] | U@1000 cd/m² [V] | CIE [x/y] | Lifetime [h] |
|---|---|---|---|---|---|
| 7 | P1 | 10.35 | 5.29 | 0.17/0.33 | 3000@1000 |
| 8 | P2 | 6.85 | 3.89 | 0.15/0.18 | 2200@1000 |
| 10 | C1 | 4.57 | 5.04 | 0.15/0.15 | 80@1000 |

D) Control Experiments

Checking of the Crosslinking of the Polymers

Polymers P1 to P3 are applied by spin coating to the substrates coated with PEDOT and ITO. The layer thickness is measured. The polymer film is heated at 180° C. for one hour for crosslinking. The film is then "washed" with toluene (on spin coater) and again heated at 180° C. for 10 minutes, and the layer thickness is measured again in order to check whether the polymer has been washed down, i.e. whether the crosslinking was successful or not.

The layer thicknesses of polymers P1 to P3 according to the invention (before and after crosslinking) and of comparative polymer C1 are summarised in Table 2.

TABLE 2

| Polymer | Layer thickness before crosslinking and washing process [nm] | Layer thickness after crosslinking and washing process [nm] | Ratio before/after [%] |
|---|---|---|---|
| P1 | 67 | 63 | 94 |
| P2 | 65 | 62 | 95 |
| P3 | 66 | 65 | 98 |
| C1 | 65 | 23 | 35 |

The results show that the crosslinking is virtually complete in the case of polymers P1 to P3. Compared with comparative polymer C1, the layer thickness can be controlled with the crosslinkable polymers according to the invention.

The invention claimed is:

1. Polymer containing at least one structural unit of the general formula I,

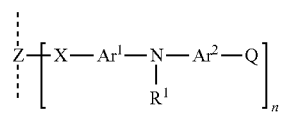

wherein

Z is an aromatic or an heteroaromatic ring system, optionally substituted by one or more radical R, wherein the aromatic or heteroaromatic ring system is selected from the group consisting of benzene, naphthalene, anthracene, phenanthrene, pyrene, chrysene, perylene, fluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine, benzothiadiazole, benzanthrene, benzanthracene, rubicene and triphenylene, R is selected on each occurrence, independently of one another, from F, Cl, Br, I, $N(Ar)_2$, $N(R^2)_2$, CN, $NO_2$, $Si(R^2)_3$, $B(OR^2)_2$, $C(=O)Ar$, $C(=O)R^2$, $P(=O)(Ar)_2$, $P(=O)(R^2)_2$, $S(=O)Ar$, $S(=O)R^2$, $S(=O)_2Ar$, $S(=O)_2R^2$, $CR^2=CR^2Ar$, $OSO_2R^2$, a straight-chain alkyl, alkoxy or thioalkoxy group having 1 to 40 C atoms or a branched or cyclic alkyl, alkoxy or thioalkoxy group having 3 to 40 C atoms, each of which optionally substituted by one or more radicals $R^2$, where in the straight-chain alkyl, alkoxy or thioalkoxy group having 1 to 40 C atoms or in the branched or cyclic alkyl, alkoxy or thioalkoxy group having 3 to 40 C atoms one or more non-adjacent $CH_2$ groups optionally replaced by $R^2C=CR^2$, $C\equiv C$, $Si(R^2)_2$, $Ge(R^2)_2$, $Sn(R^2)_2$, $C=O$, $C=S$, $C=Se$, $C=NR^2$, $P(=O)(R^2)$, SO, $SO_2$, $NR^2$, O, S or $CONR^2$ and where in the straight-chain alkyl, alkoxy or thioalkoxy group having 1 to 40 C atoms or in the branched or cyclic alkyl, alkoxy or thioalkoxy group having 3 to 40 C atoms one or more H atoms optionally replaced by F, Cl, Br, I, CN or $NO_2$, where two or more substituents R optionally form a mono- or polycyclic, or aromatic ring system with one another, where $R^2$ is in each case, independently of one another, H or an aliphatic or aromatic hydrocarbon radical having 1 to 20 C atoms, X is selected from a direct bond, a linear or branched alkylene group having 1 to 20 C atoms, in which one or more non-adjacent $CH_2$ groups are optionally replaced by —O—, —S—, —NH—, —N(CH$_3$)—, —N—CO—, —N—CO—O—, —N—CO—, N, —CO—, —O—CO—, —S—CO—, —O—COO—, —CO—S—, —CO—O—, —CH(halogen)-, —CH(CN)—, —CH=CH— or —C≡C—, or a cyclic alkyl group, $Ar^1$ and $Ar^2$
are an optionally substituted aryl or an optionally substituted heteroaryl group, which are optionally linked to one another, Q is a crosslinkable group, $R^1$ is a straight-chain alkyl, alkoxy or thioalkoxy group having 1 to 40 C atoms or a branched or cyclic alkyl, alkoxy or thioalkoxy group having 3 to 40 C atoms or a silyl group or substituted keto group having 1 to 40 C atoms, or an optionally substituted aromatic or heteroaromatic ring system having 5 to 60 ring atoms, or an aryloxy or heteroaryloxy group having 5 to 60 ring atoms, or a combination of these systems, or $Ar^2$, where one or more H atoms is optionally replaced by fluorine, n is 1, 2, 3 or 4, and the dashed lines represent the linking in the polymer, wherein if n=1 or if Z=fluorene and n=2, X is not a direct bond.

2. The polymer of claim 1, wherein Q is a vinyl or alkenyl group.

3. The polymer of claim 1, wherein Z is selected from the group consisting of fluorene, spirobifluorene, indenofluorene, anthracene, phenanthrene, and dihydrophenanthrene.

4. The polymer of claim 1, wherein $Ar^1$ and $Ar^2$ are each, independently of one another, an optionally substituted aryl or heteroaryl group having 5 to 60 ring atoms.

5. The polymer of claim 1, wherein $Ar^1$ is an optionally substituted 1,4-linked aryl or heteroaryl group.

6. The polymer of claim 1, wherein the polymer contains further structural units which are different from the general formula I.

7. A formulation comprising the polymer of claim 1 in one or more solvents.

8. An electronic device comprising the polymer of claim 1.

9. The electronic device of claim 8, wherein said polymer is crosslinked.

10. The electronic device of claim 8, wherein said polymer is present in said electronic device as a hole-transport, a hole-injection, an emitter, an electron-transport, an electron-injection, a charge-blocking, and/or a charge-generation layer.

11. The electronic device of claim 8, wherein said electronic device is an organic electroluminescent device, a polymeric electroluminescent device, an organic integrated circuit, an organic field-effect transistor, an organic thin-film transistor, an organic light-emitting transistor, an organic solar cell, an organic optical detector, an organic photoreceptor, an organic field-quench device, a light-emitting electrochemical cell or an organic laser diode.

12. A compound of formula II,

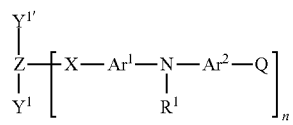

II wherein

Z is an aromatic or an heteroaromatic ring system, optionally substituted by one or more radical R, wherein the aromatic or heteroaromatic ring system is selected from the group consisting of benzene, naphthalene, anthracene, phenanthrene, pyrene, chrysene, perylene, fluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine, benzothiadiazole, benzanthrene, benzanthracene, rubicene and triphenylene, R is selected on each occurrence, independently of one another, from F, Cl, Br, I, $N(Ar)_2$, $N(R^2)_2$, CN, $NO_2$, $Si(R^2)_3$, $B(OR^2)_2$, $C(=O)Ar$, $C(=O)R^2$, $P(=O)(Ar)_2$, $P(=O)(R^2)_2$, $S(=O)Ar$, $S(=O)R^2$, $S(=O)_2Ar$, $S(=O)_2R^2$, $CR^2=CR^2Ar$, $OSO_2R^2$, a straight-chain alkyl, alkoxy or thioalkoxy group having 1 to 40 C atoms or a branched or cyclic alkyl, alkoxy or thioalkoxy group having 3 to 40 C atoms, each of which optionally substituted by one or more radicals R2, where in the straight-chain alkyl, alkoxy or thioalkoxy group having 1 to 40 C atoms or in the branched or cyclic alkyl, alkoxy or thioalkoxy group having 3 to 40 C atoms one or more non-adjacent $CH_2$ groups optionally replaced by $R^2C=CR^2$, $C≡C$, $Si(R^2)_2$, $Ge(R^2)_2$, $Sn(R^2)_2$, $C=O$, $C=S$, $C=Se$, $C=NR^2$, $P(=O)(R^2)$, SO, $SO_2$, $NR^2$, O, S or $CONR^2$ and where in the straight-chain alkyl, alkoxy or thioalkoxy group having 1 to 40 C atoms or in the branched or cyclic alkyl, alkoxy or thioalkoxy group having 3 to 40 C atoms one or more H atoms optionally replaced by F, Cl, Br, I, CN or $NO_2$, where two or more substituents R optionally form a mono- or polycyclic, aliphatic or aromatic ring system with one another, where $R^2$ is in each case, independently of one another, H or an aliphatic or aromatic hydrocarbon radical having 1 to 20 C atoms, X is selected from a direct bond, a linear or branched alkylene group having 1 to 20 C atoms, in which one or more non-adjacent $CH_2$ groups are optionally replaced by —O—, —S—, —NH—, —N($CH_3$)—, —N—CO—, —N—CO—O—, —N—CO—, N, —CO—, —O—CO—, —S—CO—, —O—COO—, —CO—S—, —CO—O—, —CH(halogen)-, —CH(CN)—, —CH=CH— or —C≡C—, or a cyclic alkyl group, $Ar^1$ and $Ar^2$
are an optionally substituted aryl or an optionally substituted heteroaryl group, which are optionally linked to one another, Q is a crosslinkable group, $R^1$ is a straight-chain alkyl, alkoxy or thioalkoxy group having 1 to 40 C atoms or a branched or cyclic alkyl, alkoxy or thioalkoxy group having 3 to 40 C atoms or a silyl group or substituted keto group having 1 to 40 C atoms, or an optionally substituted aromatic or heteroaromatic ring system having 5 to 60 ring atoms, or an aryloxy or heteroaryloxy group having 5 to 60 ring atoms, or a combination of these systems, or $Ar^2$, where one or more H atoms is optionally replaced by fluorine, $Y^1$ and $Y^{1'}$
are each leaving groups, n is 1, 2, 3 or 4, and wherein if n=1 or if Z=fluorene and n=2, X is not a direct bond.

13. The compound of claim 12, wherein $Y^1$ and $Y^{1'}$ are each selected, independently of one another, from halide, boric acid, boric acid ester, borane, mesitylate and triflate.

* * * * *